(12) United States Patent
Ageishi et al.

(10) Patent No.: US 8,103,488 B2
(45) Date of Patent: *Jan. 24, 2012

(54) TIRE DESIGN METHOD

(75) Inventors: Naoya Ageishi, Osaka (JP); Yoshihiro Tanaka, Osaka (JP); Ken Ishihara, Osaka (JP)

(73) Assignee: Toyo Tire & Rubber Co., Ltd., Osaka (JP)

( * ) Notice: Subject to any disclaimer, the term of this patent is extended or adjusted under 35 U.S.C. 154(b) by 826 days.

This patent is subject to a terminal disclaimer.

(21) Appl. No.: 12/131,993

(22) Filed: Jun. 3, 2008

(65) Prior Publication Data

US 2008/0302465 A1     Dec. 11, 2008

(30) Foreign Application Priority Data

Jun. 8, 2007   (JP) .................................. 2007-152350

(51) Int. Cl.
*G06F 17/10* (2006.01)

(52) U.S. Cl. ............... 703/2; 703/1; 703/6; 700/117

(58) Field of Classification Search .................. 703/1, 2, 703/6, 8; 156/110.1; 700/95, 97, 117
See application file for complete search history.

(56) References Cited

U.S. PATENT DOCUMENTS

| | | | |
|---|---|---|---|
| 5,361,816 A | | 11/1994 | Hitzky |
| 5,710,718 A | * | 1/1998 | Kamegawa et al. ............... 703/1 |
| 6,083,268 A | | 7/2000 | Kelsey et al. |
| 6,230,112 B1 | | 5/2001 | Ishiyama |
| 6,430,993 B1 | * | 8/2002 | Seta ................................. 73/146 |
| 6,531,012 B2 | * | 3/2003 | Ishiyama .................... 156/110.1 |
| 2001/0032694 A1 | | 10/2001 | Ishiyama |
| 2002/0014294 A1 | | 2/2002 | Okano et al. |
| 2002/0056496 A1 | | 5/2002 | Tanaka et al. |
| 2008/0270084 A1 | * | 10/2008 | Ageishi ............................. 703/1 |
| 2008/0300840 A1 | * | 12/2008 | Tanaka et al. ..................... 703/7 |
| 2008/0302465 A1 | * | 12/2008 | Ageishi et al. ............. 156/110.1 |
| 2008/0302466 A1 | | 12/2008 | Ageishi et al. |

FOREIGN PATENT DOCUMENTS

| | | |
|---|---|---|
| JP | 2002-15010 | 1/2002 |
| JP | 2002-149717 | 5/2002 |
| JP | 2003-16141 | 1/2003 |
| JP | 2003-150645 | 5/2003 |
| JP | 2005-008011 | 1/2005 |

(Continued)

OTHER PUBLICATIONS

Hasegawa et al., "A Method for the Shape and Topology Optimization of Mechanical Structures by Using Genetic Algorithm," Transactions of Japan Society of Mechanical Engineers (Series A), 61(581):183-190 (1995).

(Continued)

*Primary Examiner* — Russell Frejd
(74) *Attorney, Agent, or Firm* — Fish & Richardson P.C.

(57) ABSTRACT

In a tire design method, a numerical optimization is performed according to a basis vector process using an FEM model to obtain an optimal solution which optimizes an objective function for a tread pattern shape. A numerical optimization is performed according to an ECAT using the FEM model to obtain an optimal solution which optimizes the objective function for the tread pattern shape. Either of the calculations is executed first, and the optimal solution obtained at the first calculation is used as an initial shape when the other numerical optimization is performed.

8 Claims, 11 Drawing Sheets

FOREIGN PATENT DOCUMENTS

| JP | 2005-065996 | 3/2005 |
|---|---|---|
| JP | 2005-100282 | 4/2005 |
| JP | 2006-111168 | 4/2006 |
| JP | 2006-199217 | 8/2006 |

OTHER PUBLICATIONS

Tsuruta et al., "A Method for Shape and Topology Optimization of Mechanical Structures by Using Genetic Algorithm," Transactions of Japan Society of Mechanical Engineers (Series A), 63(605):170-177 (1997).

Suzuki et al., "A Method for Shape and Topology Optimization of Mechanical Structures by Using Genetic Algorithm," Transactions of Japan Society of Mechanical Engineers (Series A), 64(626):49-54 (1998).

Zhang, S., "Computer Aided Shape Optimization for Engineering Design With MSC/NASTRAN," pp. 1-20.

Leiva and Watson, "Automatic Generation of Basis Vectors for Shape Optimization in the *Genesis* Program," American Institute of Aeronautics and Astronautics, pp. 1-8.

Zhang, "Modified Thermal Load Approach for Automatic Generation of Basis Vectors in Shape Optimization," American Institute of Aeronautics and Astronautics, pp. 384-390.

Au et al., "A Fuzzy Approach to Partitioning Continuous Attributes for Classification" (2006).

Camacho, G.T., et al., "Adaptive Lagrangian Modeling of Ballistic Penetration of Metallic Targets," Computer Methods in Applied Mechanics and Engineering (1997).

Final Office Action dated Mar. 3, 2011 mailed in corresponding U.S. Appl. No. 12/106,384.

Japanese Office Action dated Apr. 14, 2011 mailed in co-pending Japanese Application No. 2007-152348 and English translation thereof.

Japanese Office Action dated Apr. 14, 2011 mailed in co-pending Japanese Application No. 2007-118714 and English translation thereof.

Non-Final Office Action dated Mar. 17, 2011 mailed in corresponding U.S. Appl. No. 12/132,006.

Non-Final Office Action dated Sep. 30, 2010 mailed in corresponding U.S. Appl. No. 12/106,384.

Non-Final Office Action dated Sep. 30, 2010 mailed in corresponding U.S. Appl. No. 12/098,780.

Notice of Allowance dated Mar. 1, 2011 mailed in corresponding U.S. Appl. No. 12/098,780.

J.R. Cho, et al., "Mesh Generation Considering Detailed Tread Blocks for Reliable 3D Tire Analysis," Advances in Engineering Software 35 (2004).

Kim et al., "Variable Chromosome Length Genetic Algorithm for Structural Topology Design Optimization" (2004).

Patel, H.D., "Shape Parameterization and Optimization Using the Boundary Shapes Concept" (2006).

* cited by examiner

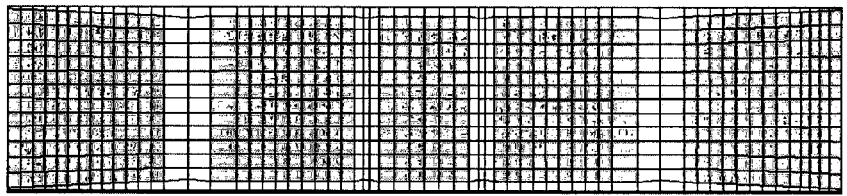
Fig.4A ORIGINAL SHAPE
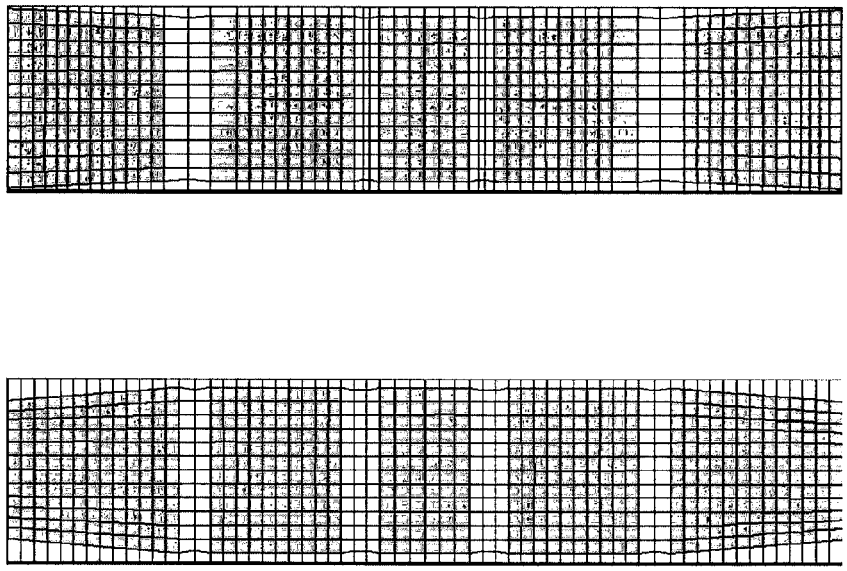
Fig.4B BASE SHAPE 1
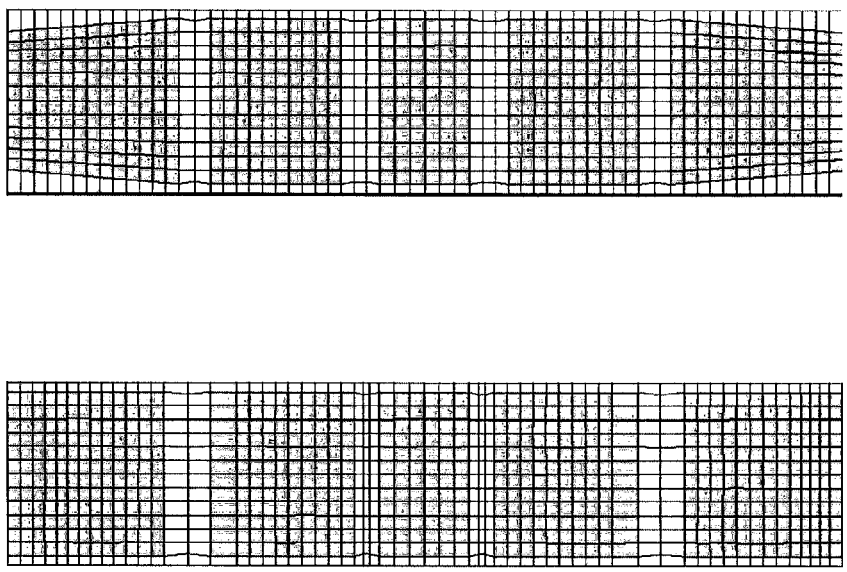
Fig.4C BASE SHAPE 2
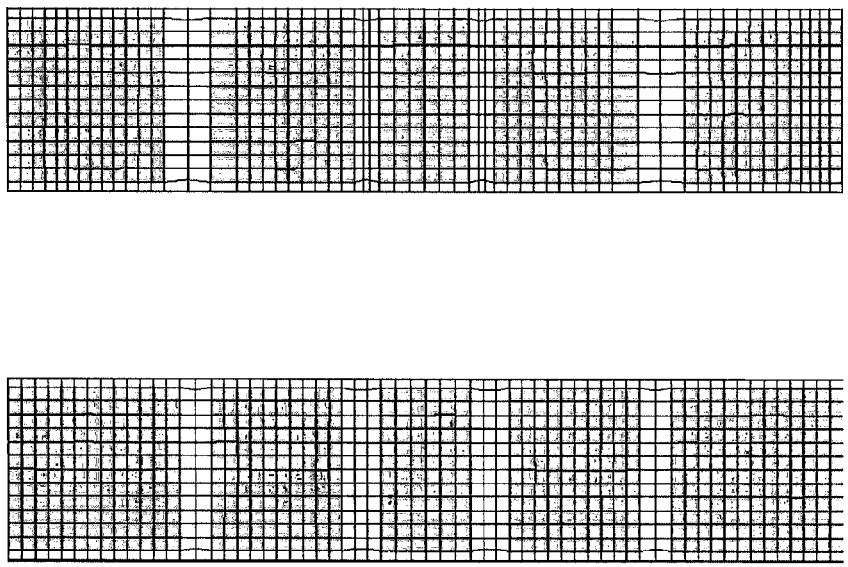
Fig.4D OPTIMIZED SHAPE

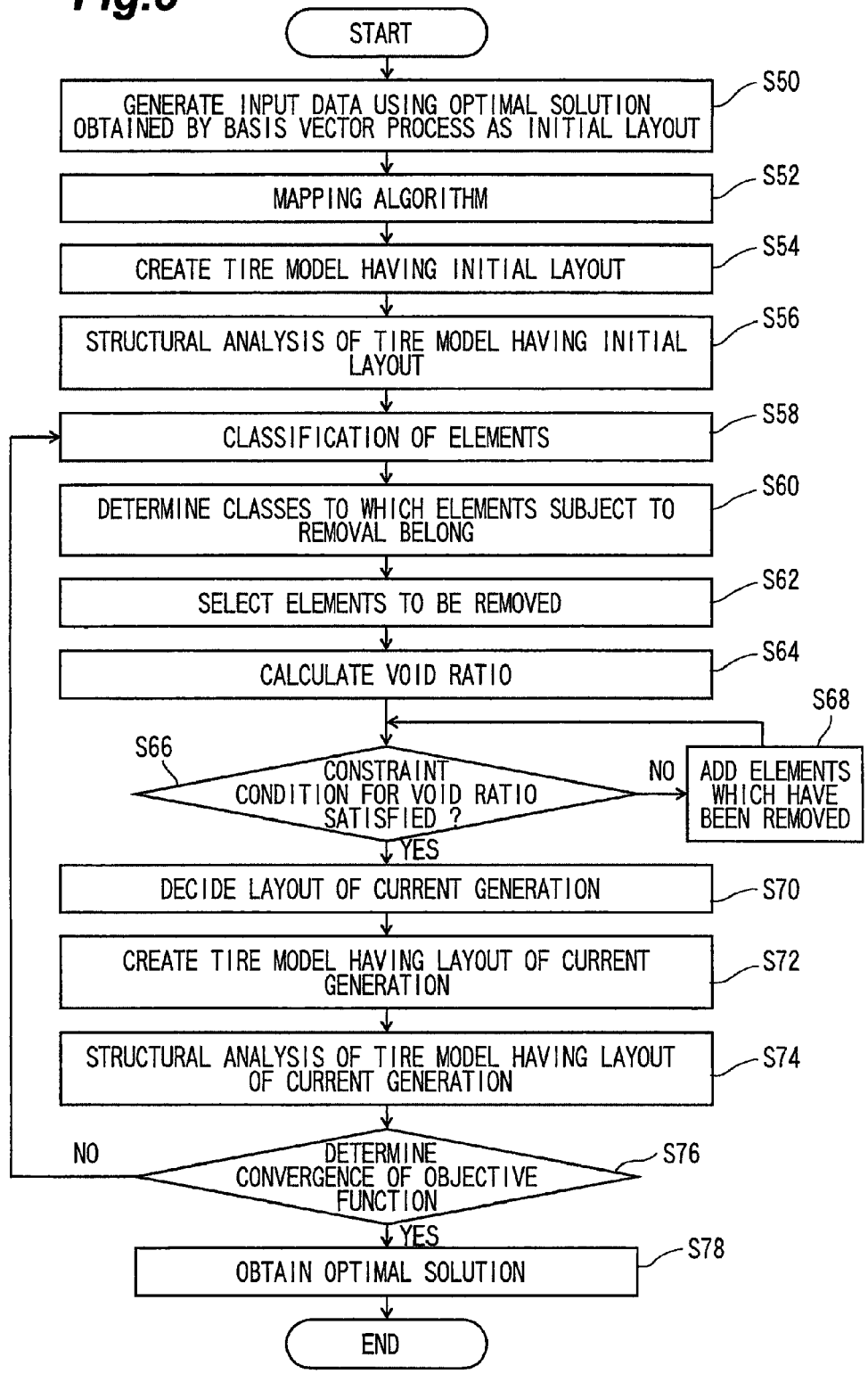

TIRE DESIGN METHOD

CROSS-REFERENCE TO RELATED APPLICATIONS

This application is based upon and claims the benefit of priority from the prior Japanese Patent Application No. 2007-152350, filed on Jun. 8, 2007; the entire contents of which are incorporated herein by reference.

BACKGROUND

The present invention relates to a tire design method.

Since a tread pattern of a pneumatic tire has significant influence on hydroplaning performance, braking performance, and noises, there are demands for designs of tire tread patterns having optimized topology and shapes.

When a tire tread pattern is designed, a design plan satisfying performance requirements is made based on knowledge of the related art, experiences, and limitations on designing. One approach for verification of the design is to check whether the performance requirements are satisfied or not using a structural analysis. When it is revealed at this stage that the performance requirements are not satisfied, the design is corrected, and a structural analysis is conducted again to verify the design. This process is repeated until the performance requirements are satisfied, and a design plan is thereby finalized.

According to the design method in the related art, no guarantee is given on whether a design plan finalized within a range set based on design limitations provides optimal values or not. Since the method involves the process of repeating designing, structural analysis, and re-designing, a design task will require an enormous amount of time. Under the circumstance, various methods for optimizing a tire through numerical optimizations have been proposed in an intention to allow efficient designing (see U.S. Pat. Nos. 5,710,718A, 6,230,112B1, 6,531,012B2, Japanese Patent Laid-Open No. JP-A-2005-008011).

In general, a generic algorithm is frequently used for numerical optimizations to optimize the shape of a tire tread pattern (for example, see U.S. Pat. No. 5,710,718A). However, there is a great number of individual genes in the case of pattern designing of a wide area. Then, the computational cost is increased, and the approach is not effective enough to be used for practical design tasks.

According to a method of optimizing a tread pattern shape in the related art, elements which directly determine a tread pattern shape such as the length and shape of each edge of a block are used as design variables. For this reason, the method is limited to tread pattern shapes which can be defined by parameters having a fixed form such as straight lines and sine curves. Therefore, the method is limited in the range for searching an optimal solution, and it has a problem in that a mesh forming finite elements must be re-created each time a design variable is changed.

Layout optimization techniques employing the finite element method includes the ECAT (Evolutionary Clustering Algorithm for Topological Optimization). According to the ECAT, a structure of interest is regarded as an individual body, and elements are classified according to the magnitudes of their evaluation indices which are determined according to the problem to be solved. A global distribution of the evaluation indices in the structure is obtained, and actions of removing or adding each class of elements having small evaluation indices one after another are regarded as behaviors. Then, a layout is decided through evolution of such behaviors. Although the ECAT has been used for layout optimization problems in mechanical structures such as cantilevers, no application of this method to a tire tread pattern has been known.

Methods of optimizing structures using a basis vector process are disclosed in JP-A-2002-149717 and JP-A-2005-065996. JP-A-2002-149717 and JP-A-2002-065996 disclose optimization of the shape of a disk arm and optimization of the shape of a golf club head, respectively. Both of the publications address methods for optimizing relatively simple shapes and do not propose optimization of complicated shapes such as tire tread patterns.

SUMMARY

The invention has been made taking the above-described points into consideration, and it is an object of the invention to provide a tire design method which allows an optimal solution to be searched in a wider range, which makes it possible to search a tread pattern shape that is optimal for required tire performance, and which allows improved tire performance to be obtained through efficient designing.

A tire design method according to embodiments of the invention includes:

(a) deciding an objective function associated with tire performance;

(b) performing a numerical optimization using a basis vector process to obtain an optimal solution which optimizes the objective function, the optimization being performed using a model provided by dividing at least part of a tread pattern into a plurality of elements; and (c) performing a numerical optimization using an ECAT to obtain an optimal solution which optimizes the objective function, the optimization being performed using the model provided by dividing at least part of a tread pattern into a plurality of elements. Either step (b) or (c) is executed first. When the other step is executed, the numerical optimization performed using the optimal solution obtained at the first step as an initial shape.

BRIEF DESCRIPTION OF THE DRAWINGS

FIGS. 4A, 4B, 4C and 4D are plan views showing an original shape, a base shape 1, a base shape 2, and an optimized shape associated with the optimization using a basis vector process, respectively;

FIG. 5 is a flow chart showing a flow of a numerical optimization for a tread pattern shape using an ECAT;

DETAILED DESCRIPTION

Figure 1:
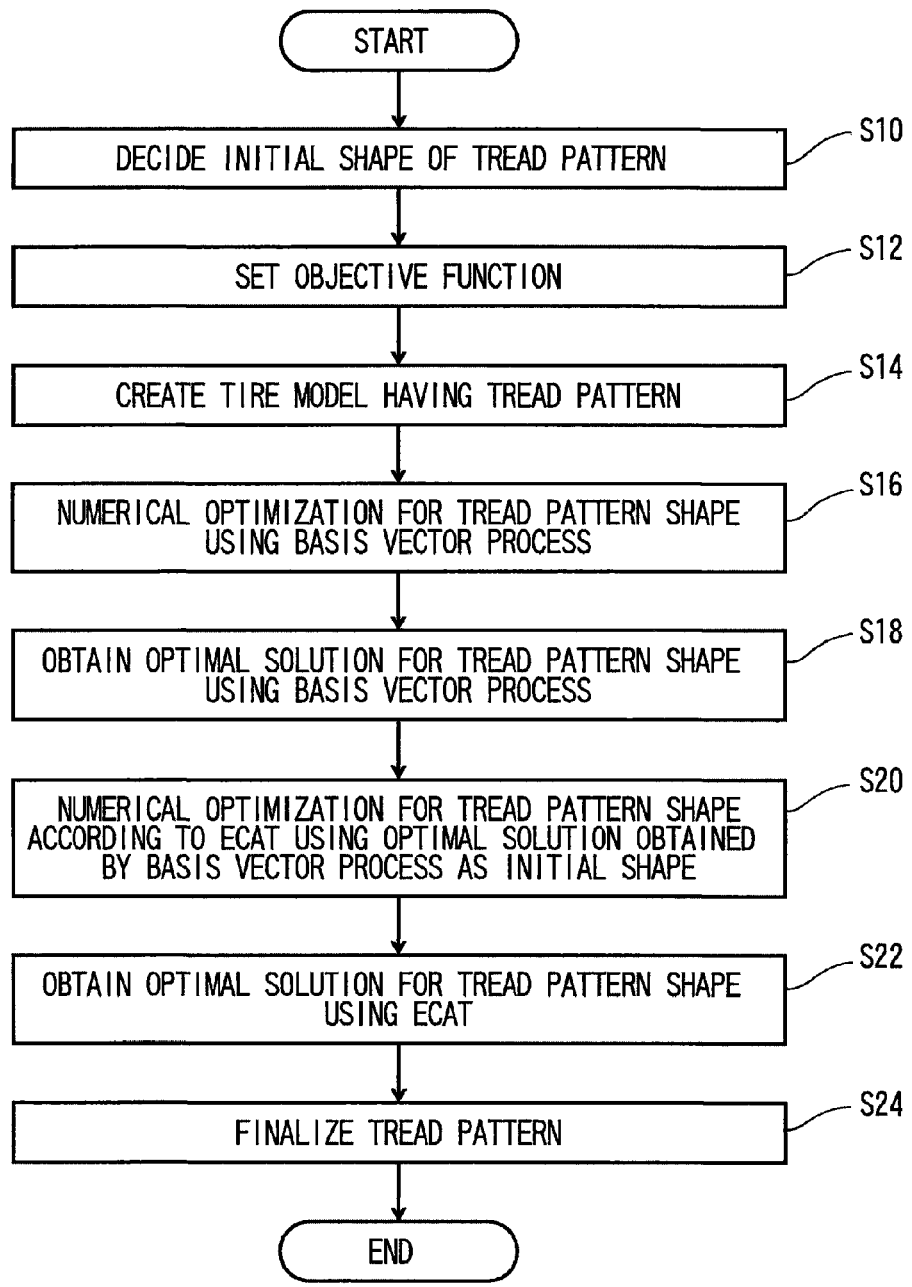
FIG. 1 is a flow chart showing a flow of processes of a tire design method in a first embodiment of the invention.

In an embodiment of the invention, the shape of a tire tread pattern is optimized using a combination of a basis vector process and an ECAT. An ECAT is suitable for optimization of the topology and shape of a tread pattern, and a basis vector process is suitable for optimization of a tread pattern shape such as a block shape. Therefore, a tread pattern can be designed with optimal topology and shape when optimization is carried out using a combination of those processes, and a significant improvement can be achieved in tire performance.

Referring to optimization of a layout using an ECAT, elements of the layout are classified according to the magnitudes of evaluation indices calculated from a model of the layout, and a global distribution of the evaluation indices in the layout is obtained. Actions of removing and adding (restoring) elements are regarded as behaviors, and a final layout is decided through evolution of such behaviors. Since optimization is carried out by obtaining a global distribution of evaluation indices as thus described, a global optimal solution can be obtained instead of localized solutions, and the performance of a tire can therefore be improved. The embodiment results in lower computational costs than using a generic algorithm according to the related art. Therefore, features of a tread pattern can be efficiently designed.

Optimization using a basis vector process makes it possible to easily create a tread pattern shape which is difficult to define using a parameter having a fixed form. As a result, an optimal solution can be searched in a wider range. Since each change in a design variable rarely necessitates redefining of the mesh of a model, man-hour for designing can be reduced.

The ECAT is described in Documents 1 to 3 listed below, the entire contents (all pages) of which are incorporated herein by reference.

Document 1: Hiroshi Hasegawa and Keishi Kawamo, "A Method for the Shape and Topology Optimization of Mechanical Structures by Using Generic Algorithm (Layout Optimization Method by Adoption of Removal and Addition Parameters of Elements as Chromosomes)", Transactions of Japan Society of Mechanical Engineers (Series A), Vol. 61, No. 581, (1995-1), pp. 183-190

Document 2: Yasushi Tsuruta, Hiroshi Hasegawa and Keishi Kawamo, "A Method for Shape and Topology Optimization of Mechanical Structures by Using Generic Algorithm (2nd Report, on Convergence of Solutions of Our Method by Adoption of Removal and Addition Parameters of Elements as Chromosomes)", Transactions of Japan Society of Mechanical Engineers (Series A), Vol. 63, No. 605 (1997-1), pp. 170-177

Document 3: Yusaku Suzuki, Hiroshi Hasegawa and Keishi Kawamo, "A Method for Shape and Topology Optimization of Mechanical Structures by Using Generic Algorithm (3rd Report, A Deterministic Approach with a Single Individual by Using Removal and Addition Parameters)", Transactions of Japan Society of Mechanical Engineers (Series A), Vol. 64, No. 626 (1998-10), pp. 49-54.

Embodiments of the invention will now be described with reference to the drawings.

First Embodiment

FIG. 1 is a flow chart showing a flow of processes of a method of designing a pneumatic tire in a first embodiment. In the present embodiment, the shape of a tread pattern of a pneumatic tire (in particular, the shape of a block) is optimized using a basis vector process, and the topology and shape of the tread pattern is thereafter optimized using an ECAT. The method can be carried out using a computer.

Specifically, the design method in the present embodiment can be carried out by creating a program for causing a computer to execute steps as described below and by using a computer such as a personal computer having such a program stored (installed) in a hard disk thereof. The program stored in the hard disk is read into a RAM as occasion demands to execute the same. Calculations are carried out by a CPU using various data input from an input unit such as a keyboard, and calculation results are displayed by a display unit such as a monitor. Such a program may be stored in various types of computer-readable recording media such as CD-ROMs, DVDs, MDs, and MO disks. Therefore, a drive for such a recording medium may be provided in a computer, and the program may be executed using the drive.

According to the design method in the present embodiment, an initial layout of one pitch unit of a tread pattern is decided at step S10 as an initial shape of the tread pattern. The initial layout may be decided without any particular limitation to provide, for example, a tread portion having no groove at all, a tread portion having only main grooves extending in the circumferential direction thereof, a tread portion having main grooves and lateral grooves extending in a direction across the main grooves, or a tread portion having blocks defined by main grooves and lateral grooves. In the present embodiment, a tread portion 1 has four main grooves 2 disposed in the width direction of the tire to extend in the circumferential direction (see FIG. 2) and lateral grooves 3 extending across the main grooves 2. A tread pattern which is formed by five rows of blocks 4 defined by the main grooves 2 and the lateral grooves 3 when viewed in the width direction of the tire is used as the initial layout (see FIG. 4A).

Next, at step S12, an objective function associated with tire performance is decided, and various conditions required for a numerical optimization such as analysis conditions and constraint conditions are set. The objective function may be a physical quantity whose value changes depending on the shape of the tread pattern. Specifically, the function may be ground contact pressure distribution of the tire at the time of braking and acceleration, an average ground contact pressure, stress, strain, strain energy, frictional energy, sliding velocity on road surfaces, or displacement. For example, the ground contact pressure distribution of the tire is chosen as the objective function, and an optimization problem for minimizing the function is defined.

At the next step S14, a finite element model (hereinafter referred to as "tire FEM model" or "tire model" in a shorter form) of the tire having a tread pattern in the initial layout is created. The tire model is a model of the tire created by dividing the tire including internal structures thereof into elements in the form of a mesh such that a physical quantity as described above for evaluating tire performance can be numerically and analytically obtained through a structural analysis.

Figure 2:
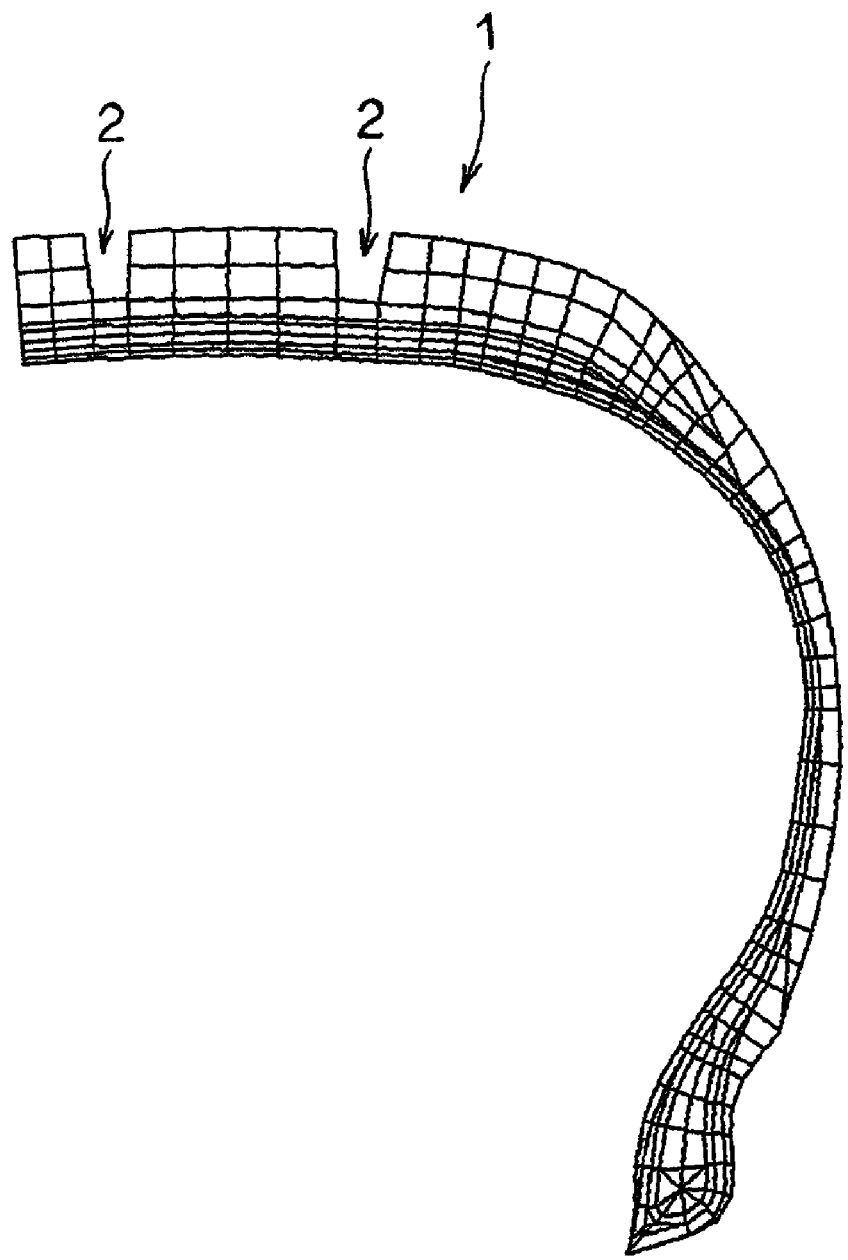
FIG. 2 is a half sectional view of a tire representing an example of a finite element model of a tire.

FIG. 2 is a view of an example of the FEM model taken on a half section of the tire. The entire width of such an FEM model is swept throughout the circumference of the tire to create a tire model that is a three-dimensional FEM model. Referring further to the creation of such an FEM model, one pitch unit of the initial layout is developed into a plurality of pitches in the circumferential direction of the tire to create an FEM model representing the entire circumference of the tire.

At the next step S16, a numerical optimization is carried out using a basis vector process to obtain an optimal solution which optimizes the objective function of the tread pattern shape.

Figure 3:
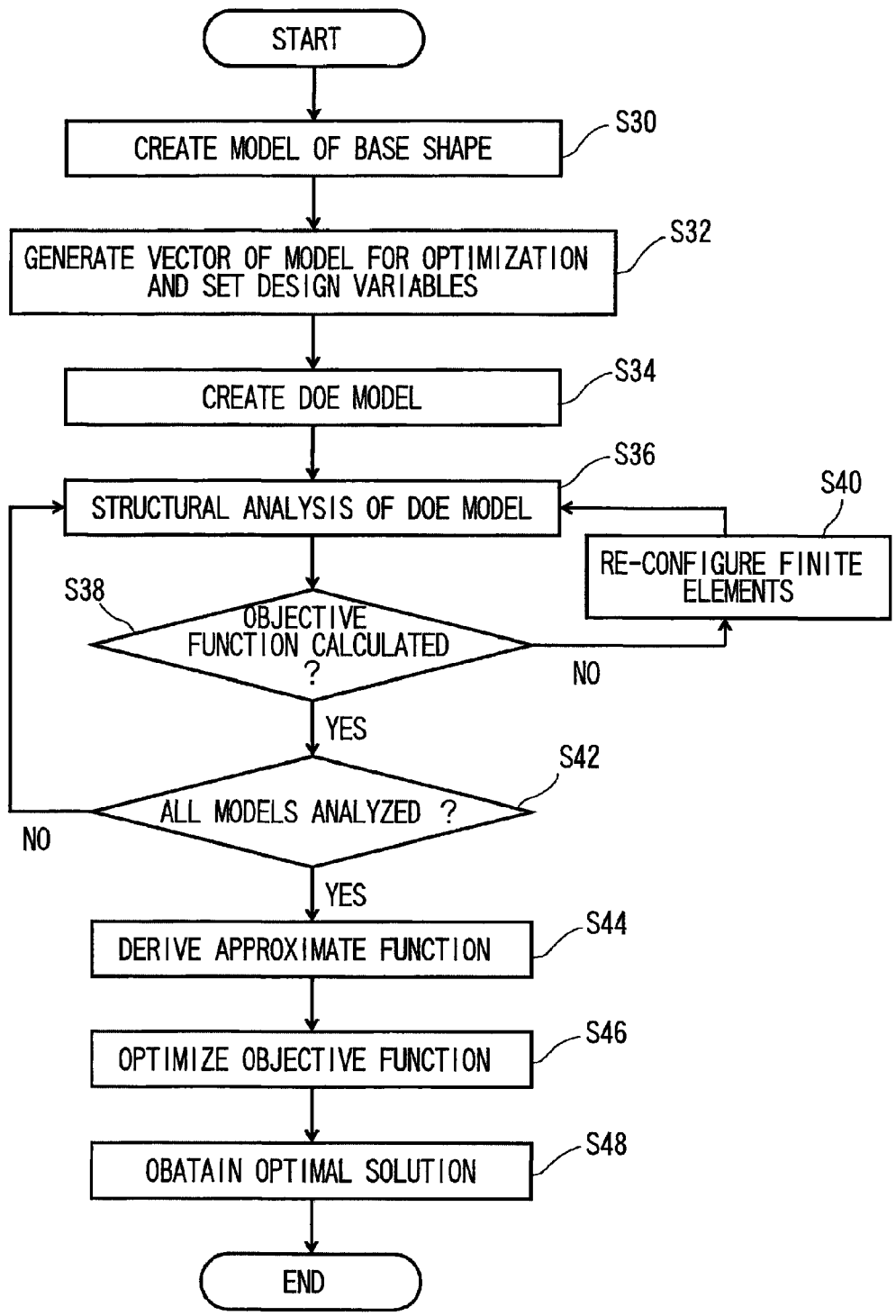
FIG. 3 is a flow chart showing a flow of a numerical optimization for a tread pattern shape using a basis vector process.

Specifically, as shown in FIG. 3, FEM models of a plurality of base shapes are first created at step S30 based on an FEM model of an original shape that is an initial shape of the tread pattern. A base shape is a tread pattern shape which has the same number of nodes and element combination information as those of the original shape and which has node coordinate values different from those of the original shape. The number of nodes is the total number of mesh intersections forming the FEM model. Element combination information is information indentifying nodes included in each element constituting the FEM model and indicating the order in which the nodes are included. Node coordinate values are coordinate values indicating the position of each node relative to an origin serving as a reference.

The FEM models of the base shapes are created such that they have shapes different from the original shape by varying the node coordinate values of the FEM model of the original shape with the number of nodes and element combination kept unchanged. Referring to the method of varying the node coordinate values, an operator may vary the node coordinate values of the FEM model of the original shape using an input unit such as a mouse while monitoring an image of the model. Alternatively, the node coordinate values may be automatically varied by a computer according to predetermined rules. Although there is no particular limitation on the number of base shapes created, it is normally preferable to create 10 or less such shapes when computational costs are considered. The number may be input by an operator based on a request signal from a computer.

By way of example, FIGS. 4B and 4C show models of two base shapes created from a model of an original shape as shown in FIG. 4A, i.e., a base shape 1 (FIG. 4B) and a base shape 2 (FIG. 4C).

At the next step S32, an FEM model for optimization is created, and design variables are set. Specifically, node coordinate values of the FEM models created as described above are regarded as components of vectors, and new vectors are created by linearly combining those vectors. An FEM model for optimization is configured using coordinate values of each node which are components of the new vectors.

In this example, a difference between a vector whose components are the coordinate values of a node of the original shape and a vector whose components are the coordinate values of a node of a base shape as described above is defined as a basis vector. Such basis vectors are linearly combined to define a vector whose components are the coordinate values of each node of the optimization model. Such a vector of the optimization model is expressed by Equation (1) shown below.

$$\vec{X}_{VAR} = \vec{X}_{ORG} + \sum_i \alpha_i (\vec{X}_{ORG} - \vec{X}_{BASE,i}) \quad (1)$$

where $\vec{X}_{ORG}$ represents a vector whose components are the coordinate values of a node of the original shape; $\vec{X}_{BASE,i}$ represents a vector whose components are the coordinate values a node of a base shape; $\vec{X}_{VAR}$ represents a vector whose components are the coordinate values each node of the optimization model; $\alpha_i$ represents a factor for linear combination; and i represents a number assigned to the base shape.

Weighting factors for linear combination represented by ai are defined as design variables in numerical optimizations which will be described later. A range of limitation is set for each of the weighting factors.

Numerical optimizations are then performed using Equation (1). Specifically, the numerical optimizations are performed based on a relational expression between a vector of the optimization model and basis vectors which is shown above as Equation (1) to obtain values of design variables at which an objective function as described above is optimized. Various known methods of optimization may be used for such numerical optimizations, including design of experiments (DOE) methods, methods utilizing generic algorithms, and mathematically programming. In the present mode of the invention, an example of numerical optimizations according to a DOE method will be described.

First, a plurality of DOE models are created according to conditions for allocation of a design of experiments based on the DOE method at step S34. Specifically, design variables are allocated to columns of an orthogonal table based on the DOE method. Referring to the orthogonal table, since there are two design variables in the present embodiment, an L27 three-level orthogonal table is used. The design variables $\alpha_1$ and $\alpha_2$ are changed to three levels corresponding to a lower limit value, an intermediate value and an upper limit value of a range of limitation and are allocated to the orthogonal table. Then, the values of the design variables are varied according to respective conditions for allocation to create FEM models for optimization in the number of rows of the orthogonal table or 27 FEM models for optimization as DOE models according to Equation (1).

Next, at step S36, an FEM analysis is carried out to obtain an objective function for each of the DOE models obtained as described above. Specifically, a structural analysis is carried out with the analysis conditions applied to the optimization FEM models to obtain respective objective functions. The structural analysis involves calculations performed on the tire models with analysis conditions applied, including the internal pressure and load of the tire and the coefficient of friction with road surface, etc. For example, the analysis may be carried out using an FEM analysis program available on the market such as "ABAQUS" manufactured by ABAQUS Inc.

The structural analysis may fail to converge, and some objective functions may not be calculated. Such a failure frequently occurs when some of elements of an optimization FEM model created based on the DOE method as described above are a significantly distorted in shape. When no objective function is calculated for a certain optimization FEM model (step S38: No), the mesh is redefined for the distorted elements to reconfigure the elements by dividing the elements into the form of a mesh (step S40). Thereafter, a structural analysis is carried out using the re-configured optimization FEM model to calculate an objective function (step S36). Thus, the problem of a failure in calculating an objective function can be solved. Since such redefinition is required only for particular regions having distorted elements of a particular FEM model as described above, increase in computational cost can be suppressed.

Such a structural analysis is repeated until an objective function is calculate for all of the 27 optimization FEM models (step S38: Yes and step S42: No), and the process proceeds to the next step when an objective function is obtained for all of the FEM models (step S42: Yes).

At the next step S44, the objective functions are represented as a function of the design variables from the relationship between the objective functions and the design variables identified as described above. Specifically, the objective functions are converted into an approximate function (response curve) of the design variables by performing polynomial approximation using a method such as regression analysis.

Thereafter, at step S46, design variables at which the objective functions are optimized are obtained from the approximate function. For example, let us assume that the objective functions are distribution of the ground contact pressure of the block and it is desired to minimize the ground contact pressure distribution. Then, the design variables included in the approximate function are varied to minimize the ground contact pressure distribution, whereby an optimal solution for the tread pattern shape is obtained (step S48).

After an optimal solution for the tread pattern shape is obtained using a basis vector process as thus described (step S18), the shape of the tread pattern is optimized using an ECAT at step S20. At this time, the numerical optimization is carried out using the optimal solution for the tread pattern shape obtained using a basis vector process at step S18 as an initial layout.

Specifically, input data for the tread pattern shape having the optimal solution according to the basis vector process as an initial layout is first created at step S50 shown in FIG. 5. That is, coordinate data of figures representing the tread pattern that is the optimal solution are created and input.

At step S52, a mapping algorithm is carried out using the input data to create a tire model having the tread pattern in the above-described initial layout from a tire model having main grooves only. The mapping algorithm is carried out for features in one pitch unit of the tread pattern.

Figure 6:
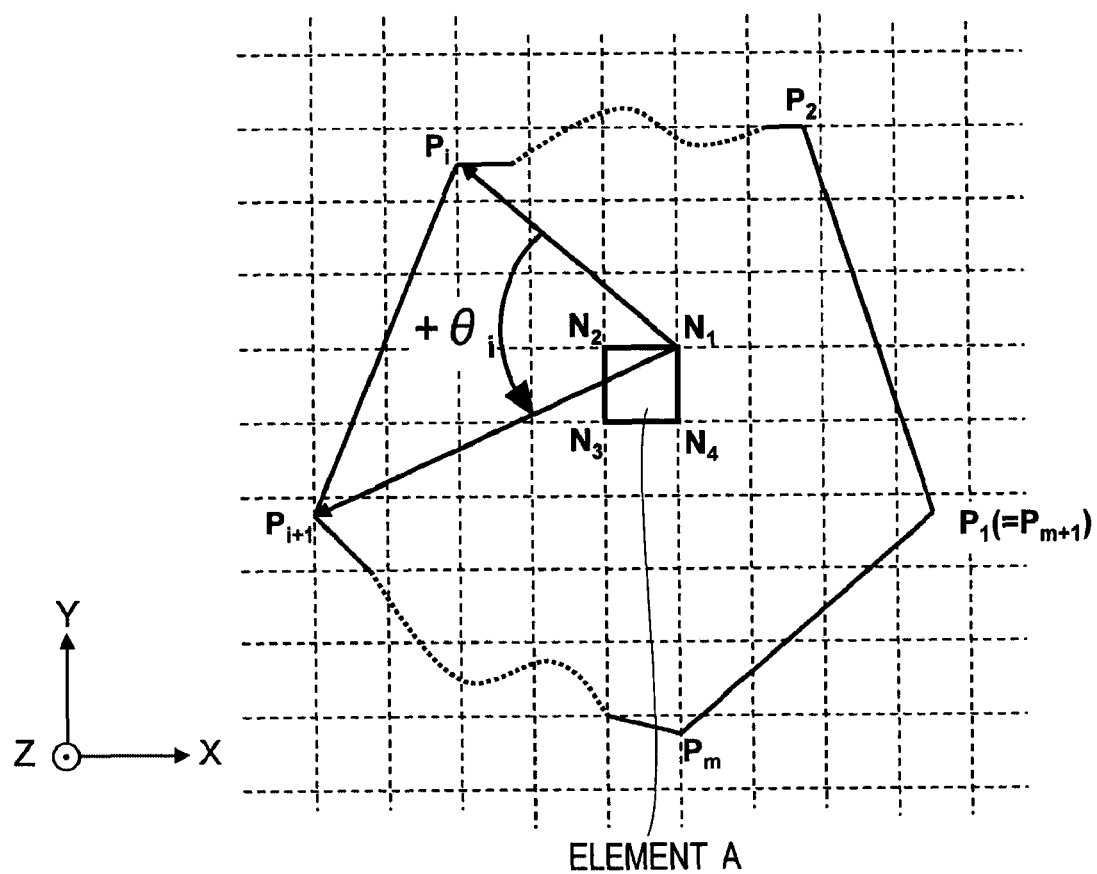
FIG. 6 shows an example in which a finite element belongs to a closed figure in a mapping process.

Process performed according to the mapping algorithm will now be described. FIG. 6 shows a relationship between a closed figure (m-polygon) $P_1$-$P_2$-...-$P_i$-$P_{i+1}$-...-$P_m$ that is one of features of the initial layout and the FEM model, dotted lines representing finite elements. Let us first discuss a node $N_1$ which is one of nodes forming a finite element A. First, the vector product of a vector $N_1P_i$ and a vector $N_1P_{i+1}$ is obtained, and the sign of a z-component of the vector product is identified. At the same time, an angle $\theta_i$ (<180°) defined by the vector $N_1P_i$ and the vector $N_1P_{i+1}$ is obtained. This process is carried out for each value of "i" (i=1 to m). Next, Equation (2) shown below is calculated. It is determined that the node $N_1$ is in the closed figure when $|\theta_{total}|>180°$ and that the node $N_1$ is out of the closed figure when $|\theta_{total}| \leq 180°$.

$$\theta_{total} = \sum_{i=1}^{m} \varepsilon_i \cdot \theta_i \qquad (2)$$

where $\varepsilon_i$ is +1 when the z-component of the vector product is positive and $\varepsilon_i$ is −1 when the z-component of the vector product is negative.

Such a relationship is similarly checked at nodes $N_2$, $N_3$, and $N_4$, and it is determined that the element belongs to the closed figure only when all of the nodes forming the single element are located inside the closed figure.

As thus described, relationships between all finite elements in one pitch unit of the tread pattern and the features in the initial layout are identified to create an FEM model of the tread pattern in one pitch unit. The model is disposed to define predetermined pitches in the circumferential direction, whereby a tire model having an initial layout constituted by the tread pattern specified as described above is created (step S54).

After the tire model having the optimal solution obtained as described above using a basis vector process as an initial layout is automatically created from the tire model having main grooves only, a structural analysis of the tire model having such an initial layout is carried out at step S56 to calculate an evaluation index of each of elements of a ground contact surface of the tread pattern. The evaluation index is a physical quantity which is calculated for each element of the ground contact surface and which serves as a basis for the calculation of the objective function as tire performance. For example, the evaluation index may be stress, strain, strain energy, ground contact pressure, ground contact pressure distribution, frictional energy, sliding velocity on road surfaces, or displacement.

At the next step S58, evaluation indices calculated as described above are integrated to represent one pitch unit of each element associated therewith, and the elements are classified according to the magnitudes of the evaluation indices thus integrated.

Figure 7:
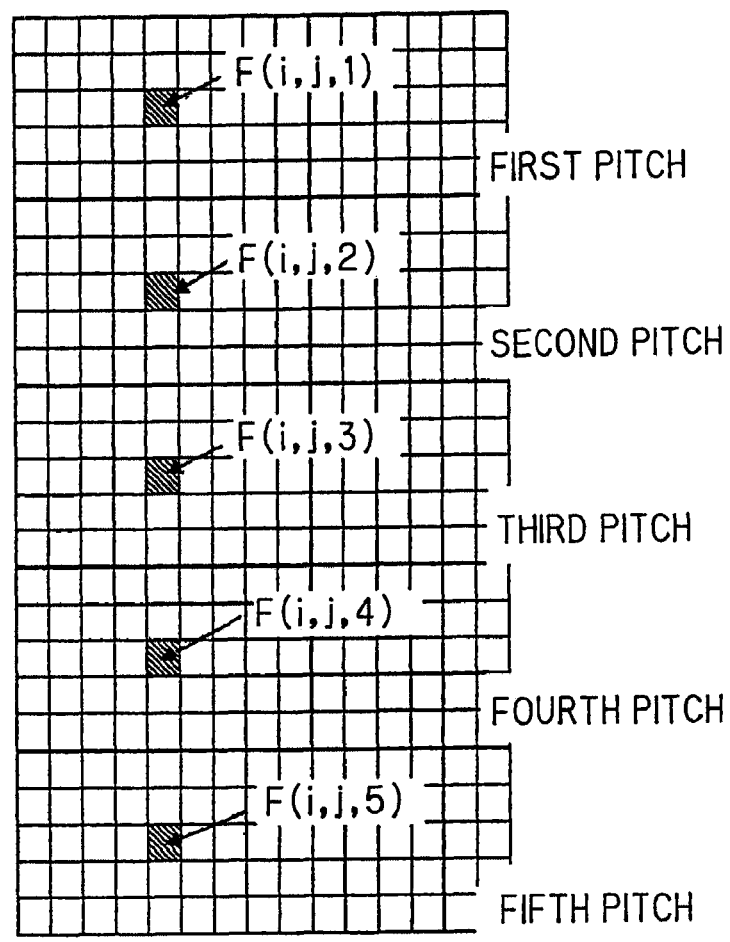
FIG. 7 shows a position for evaluating a function of an evaluation index of an arbitrary element in an example wherein a layout is developed into five pitches, such a position being shown for each pitch.

A method of integrating evaluation indices to represent one pitch unit will now be described with reference to FIGS. 7 and 8. When five pitches are periodically disposed as shown in FIG. 7, functions of the evaluation indices of elements respectively associated with the pitches are expressed as follows.

First Pitch: F(i, j, 1)
Second Pitch: F(i, j, 2)
Third Pitch: F(i, j, 3)
Fourth Pitch: F(i, j, 4)
Fifth Pitch: F(i, j, 5)

Figure 8:
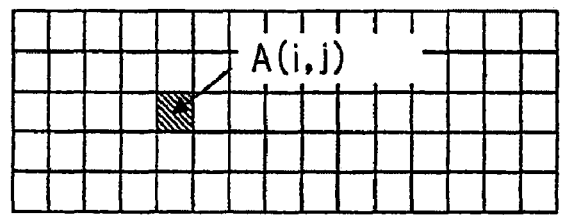
FIG. 8 shows a position for evaluating a function of an evaluation index of an arbitrary element obtained by integrating functions of evaluation indices for various pitches to represent one pitch unit.

Therefore, when those evaluation indices are integrated to represent one pitch unit as shown in FIG. 8, the evaluation index of an arbitrary element in the layout in the one pitch unit or a function A (i, j) of an integrated evaluation index is expressed by Equation (3) shown below.

$$A(i, j) = \frac{\sum_{k=1}^{N} F(i, j, k)}{N} \qquad (3)$$

where N represents the number of pitches.

When the indices are integrated to represent one pitch unit, an average value may be obtained as shown. Alternatively, a total value may be simply obtained.

Elements included in the layout of one pitch unit are classified based on an evaluation index thus integrated. Specifically, the classification is carried out by categorizing the magnitude of the evaluation index into a plurality of levels. For example, the difference between a minimum value and a maximum value of the evaluation index is divided into ten equal parts to set ten levels, and all elements are allocated to respective levels associated therewith and are thereby categorized into ten classes. The classes may be set at equal intervals as thus described and may alternatively be set at unequal intervals.

At the next step S60, classes to which elements subject to removal belong are determined. Such determination of classes subject to removal is carried out according to the level of magnitude of the evaluation index of each class.

Specifically, when elements having great evaluation indices are subject to removal just as in the case where the evaluation index is distribution of a ground contact pressure (i.e., a square of a difference between an average ground contact pressure and a ground contact pressure of an element of interest), a plurality of classes having evaluation indices on the greater side are determined as classes subject to removal. On the contrary, when elements having small evaluation indices are subject to removal (for example, when a pattern for increasing deflection of a tread portion is to be designed, elements having small displacements are removed), a plurality of classes having evaluation indices on the smaller side are determined as classes subject to removal. More specifically, classes subject to removal can be determined based on Equation (4) shown below.

$$N_{c\beta}=\beta N_{c\mu} \quad (4)$$

where $N_{c\beta}$ represents an upper limit for class numbers to which elements subject to removal belong; $N_{c\mu}$ represents class numbers to which elements having an average evaluation index value belong; and $\beta$ represents a removal factor. Elements belonging to classes having class numbers equal to and smaller than the value $N_{c\beta}$ given by Equation (4) are subject to removal. Referring to class numbers, when elements having great evaluation indices are subject to removal, the class numbers are assigned starting with the smallest number to elements having great evaluation indices in decreasing order of the magnitude of the index values. When elements having small evaluation indices are subject to removal, the class numbers are assigned starting with the smallest number to elements having small evaluation indices in increasing order of the magnitude of index values. The removal factor $\beta$ may have a predetermined value. Alternatively, it may be obtained along with an $\alpha$-cut value and an addition factor $\gamma$ by performing a numerical optimization such as a generic algorithm for coding such parameters in chromosomes as genes, as described in Document 1. The addition factor $\gamma$ is a factor defined by Equation (5) shown below as described in Document 1.

$$N_{p\gamma}=\gamma N_{ps} \quad (5)$$

where $N_{p\gamma}$ represents the number of elements added, and $N_{ps}$ represents the cumulative number of elements removed. At steps S64 to S68 which will be described later, instead of determining elements to be added based on a void ratio, a history of removal may be stored for elements which have been removed in the order of the occurrence of removal, and all of elements in places in the order of removal corresponding to values equal to or greater than the value $N_{p\gamma}$ given by Equation (5) may be added.

At the next step S62, elements to be removed are selected from each of the classes subject to removal determined at step S60, and the selected elements are removed from the layout. Elements to be removed are preferably extracted from the classes subject to removal in a fuzzy manner. In order to perform such fuzzy extraction, fuzzy partitioning is carried out by creating a membership function using the fuzzy c-means method as described in Document 1. The membership function partitions elements in a class subject to removal into elements which are subject to removal and elements which are not subject to removal using an $\alpha$-cut value, and elements to be removed are selected by obtaining the $\alpha$-cut value.

As thus described, according to the ECAT, a plurality of classes are determined as classes subject to removal, and elements to be removed are selected from each of the classes subject to removal using fuzzy partitioning. Therefore, when elements having great evaluation indices are subject to removal, this approach is more preferable than simply removing all elements starting with the class having the greatest evaluation index, in that an optimal solution can be obtained while avoiding localized solutions.

After elements are removed as thus described, elements to be restored (or added) are determined from among the elements which have been removed based on a constraint condition on the void ratio of the tread pattern. Specifically, the void ratio of the layout after the removal of the elements is first calculated at step S64. The void ratio is the ratio of the surface area of the groove portions (portions having no contact with the ground) to the entire surface area of the tread pattern in one pitch unit. Normally, an upper limit for the void ratio is set in the range from 0.25 to 0.45 as the constraint condition.

Next, it is determined at step S66 whether the calculated void ratio satisfies the constraint condition or not. When the constraint condition is not satisfied or when the calculated void ratio is in the excess of the upper limit for the void ratio that is set in advance, the elements which have been removed are added at step S68 to compensate for the shortage of elements. That is, the required number of elements is added among the elements to be removed selected at step S62 such that the constraint condition on the void ratio is satisfied. Since the evaluation indices for the elements removed at step S62 are stored, elements are added in the order of their probabilities of being left on the layout. Specifically, when elements having great evaluation indices are subject to removal, elements are added in increasing order of the magnitude of evaluation indices. When elements having small evaluation indices are subject to removal, elements are added in decreasing order of the magnitude of evaluation indices.

When it is determined at step S66 that the constraint condition is satisfied, the process proceeds to step S70 to finalize a layout of the current generation obtained by removing and adding elements at the above-described steps.

Then, a tire model having the layout of the current generation is created at step S72. At this time, an FEM model is created to represent the entire circumference of the tire by developing one pitch unit of the current generation layout into a plurality of pitches in the circumferential direction of the tire. A method of developing features in one pitch unit of the current-generation layout will now be described with reference to FIGS. 9 and 10.

Figure 9:
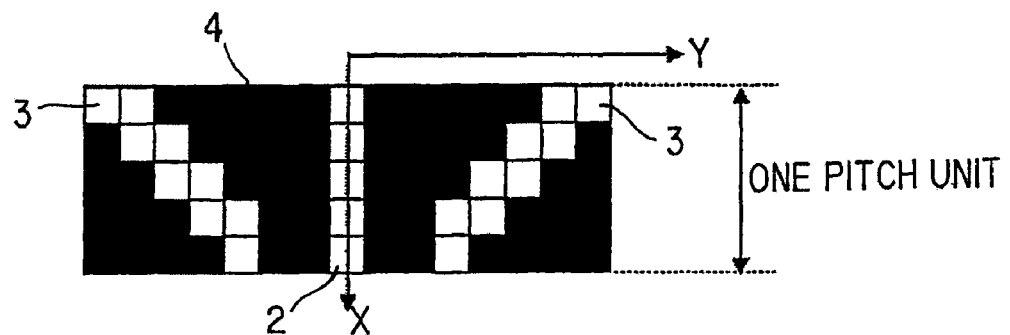
FIG. 9 shows an example of features in one pitch unit of a tread pattern.
Figure 10:
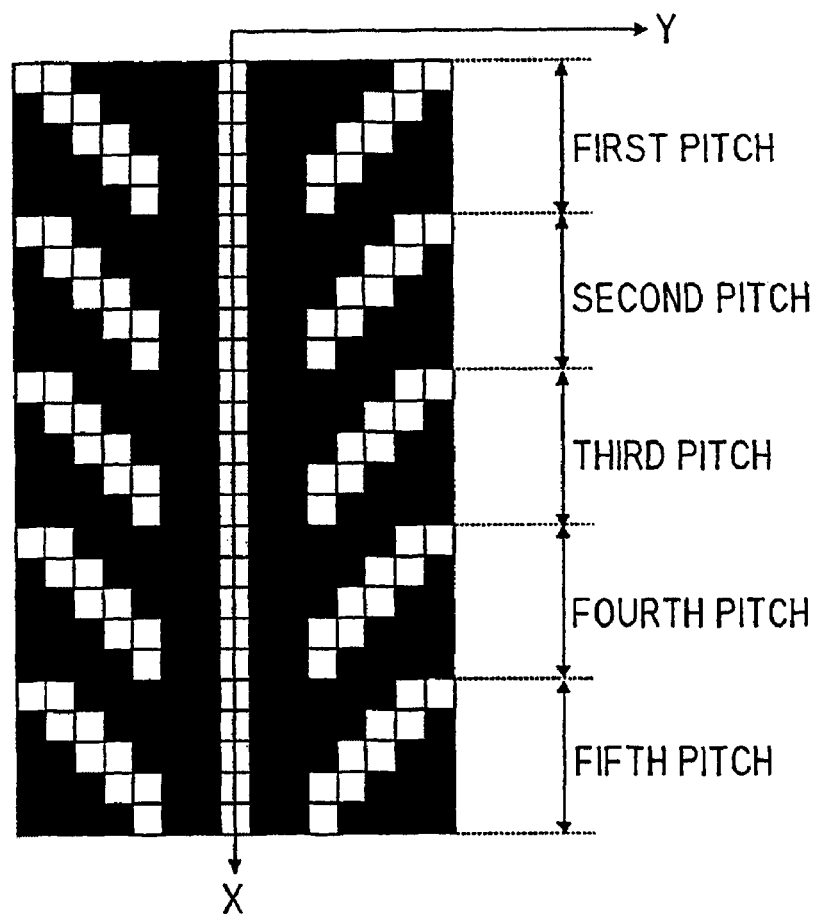
FIG. 10 shows an example in which the features in the one pitch unit are developed into five pitches.

FIG. 9 shows features in one pitch unit of the tire tread pattern extending the entire width of the tread. Reference numeral 2 represents a main groove. Reference numeral 3 represents lateral grooves. The black regions indicated by reference numeral 5 represent land portions. X represents the circumferential direction of the tire, and Y represents the width direction of the tire. The features in one pitch unit are periodically disposed in a predetermined number of pitches in the circumferential direction X of the tire as shown in FIG. 10. In the example shown in FIG. 10, the features are periodically disposed to define five pitches, i.e., first to fifth pitches.

Next, at step S74, the FEM model of the current generation layout thus obtained is used to execute a structural analysis similar to that at step S56 described above, and an evaluation index is calculated for each element on the ground contact surface of the tire tread pattern.

At step S76, the convergence of the objective function is determined. The objective function is calculated from the evaluation indices obtained through the structural analysis. For example, when the objective function is distribution of the ground contact pressure of the tire, it is calculated from the distribution of the ground contact pressure at each element which is an evaluation index. For example, convergence is determined based on whether the difference between the value of the objective function for the layout of the preceding generation and the value of the objective function for the layout of the current generation is smaller than a predetermined value or not.

When such determination indicates that the objective function has not converged yet, the layout is updated to the layout of the current generation, and the process returns to step S58. That is, elements are classified at step S58 using the layout of the current generation as an initial value, and the process then proceeds to step S60 and so on. Thus, steps S58 to S76 are repeated until the objective function converges. When it is determined at step S76 that the objective function has converged, the layout of the current generation at that time is determined to be an optimal solution (step S78).

After an optimal solution for the tread pattern shape is obtained using an ECAT as thus described (step S22), the tread pattern shape is finalized based on the optimal solution (step S24). Vulcanization molding can be carried out according to a normal method to manufacture a pneumatic tire in practice from the design of the tire having such a tread pattern. It is therefore possible to provide a pneumatic tire which is improved in tire performance associated with the objective function as described above.

In the present embodiment, a tread pattern shape is optimized using a combination of a basis vector process and an ECAT. Therefore, the topology of a tread pattern (for example, the relative position of the left and right lateral grooves 3 in the circumferential direction of the tire in the example shown in FIG. 9) and the shape of the pattern can be effectively optimized, which allows tire performance to be significantly improved.

The calculation for optimizing a layout using an ECAT makes it possible to obtain a global optimal solution instead of reaching localized solutions. Since the approach results in lower computational costs when compared to the use of a generic algorithm according to the related art, features of a tread pattern can be more efficiently designed. The structural analysis and determination of an objective function using an FEM model is carried out by developing a layout of one pitch unit into a plurality of pitches, whereas the process of removing and adding elements is carried out using a value obtained by integrating values for those pitches to represent one pitch unit. In general, features of a tire tread pattern are formed by periodically disposing features in one pitch unit in the circumferential direction of the tire. Therefore, a pattern can be optimized in a more practical manner by evaluating it using evaluation indices in a plurality of pitches of the pattern and an objective function. Since the process of removing and adding elements is executed using values integrated to represent one pitch unit, it is possible to avoid the problem of variation of a design of a feature between pitches.

The numerical optimization using a basis vector process makes it possible to easily create a tread pattern shape which is difficult to define using a parameter having a fixed form. As a result, an optimal solution can be searched in a wider range. Since each change in a design variable rarely necessitates redefining of the mesh of a model, man-hour for designing can be reduced. While features in one pitch unit of a tread pattern serve as an original shape used for the numerical optimization using a basis vector process in the present embodiment, a numerical optimization may alternatively be carried out using the shape of each block of a tread pattern separately as an original shape (a subject of designing).

Second Embodiment

Figure 11:
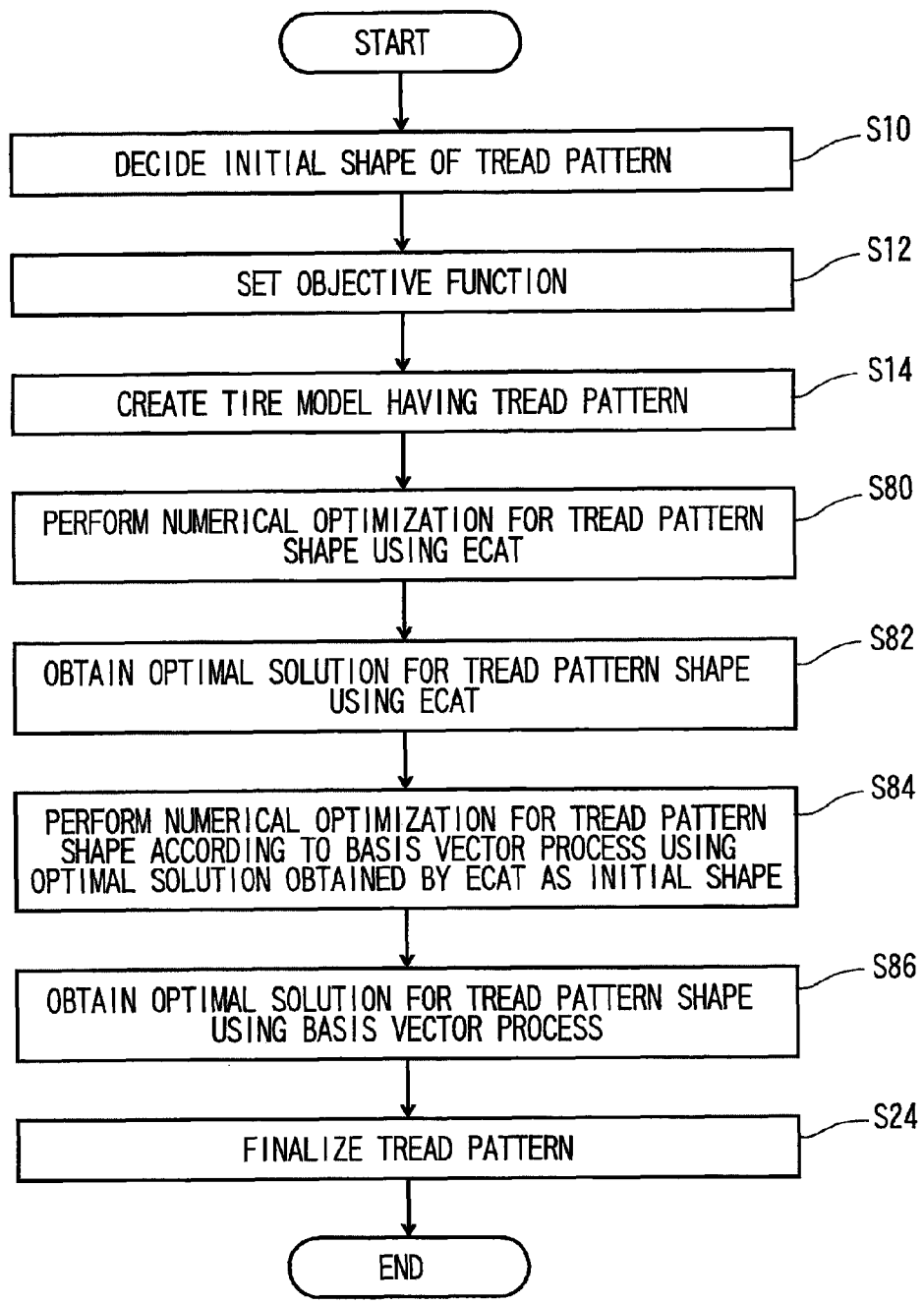
FIG. 11 is a flow chart showing a flow of processes of a tire design method in a second embodiment of the invention.

FIG. 11 is a flow chart showing a flow of processes of a method of designing a pneumatic tire in a second embodiment. In the present embodiment, the topology and shape of a tread pattern of a pneumatic tire is optimized using an ECAT, and the shape of the tread pattern (in particular, the shape of blocks thereof) is thereafter optimized using a basis vector process.

In the present embodiment, a tire model having a tread pattern is created as in the first embodiment (steps S10 to S14), a calculation for optimizing the shape of the tread pattern is carried out using an ECAT (steps S80 and S82). Then, a numerical optimization is carried out using a basis vector process for the tread pattern shape whose initial shape is the optimal solution obtained using an ECAT (steps S84 and S86). The methods for numerical optimizations using an ECAT and a basis vector process, respectively, are the same as those in the first embodiment, and no description will therefore be made on them.

The tread pattern shape is finalized based on the optimal solution for the tread pattern shape obtained as thus described using a basis vector process (step S24). Vulcanization molding can be carried out according to a normal method to manufacture a pneumatic tire in practice from the design of the tire having such a tread pattern shape. It is therefore possible to provide a pneumatic tire which is improved in tire performance associated with the objective function as described above.

The present embodiment makes it possible to optimize the topology and shape of a tread pattern efficiently and to improve tire performance significantly just as in the first embodiment.

Third Embodiment

Figure 12:
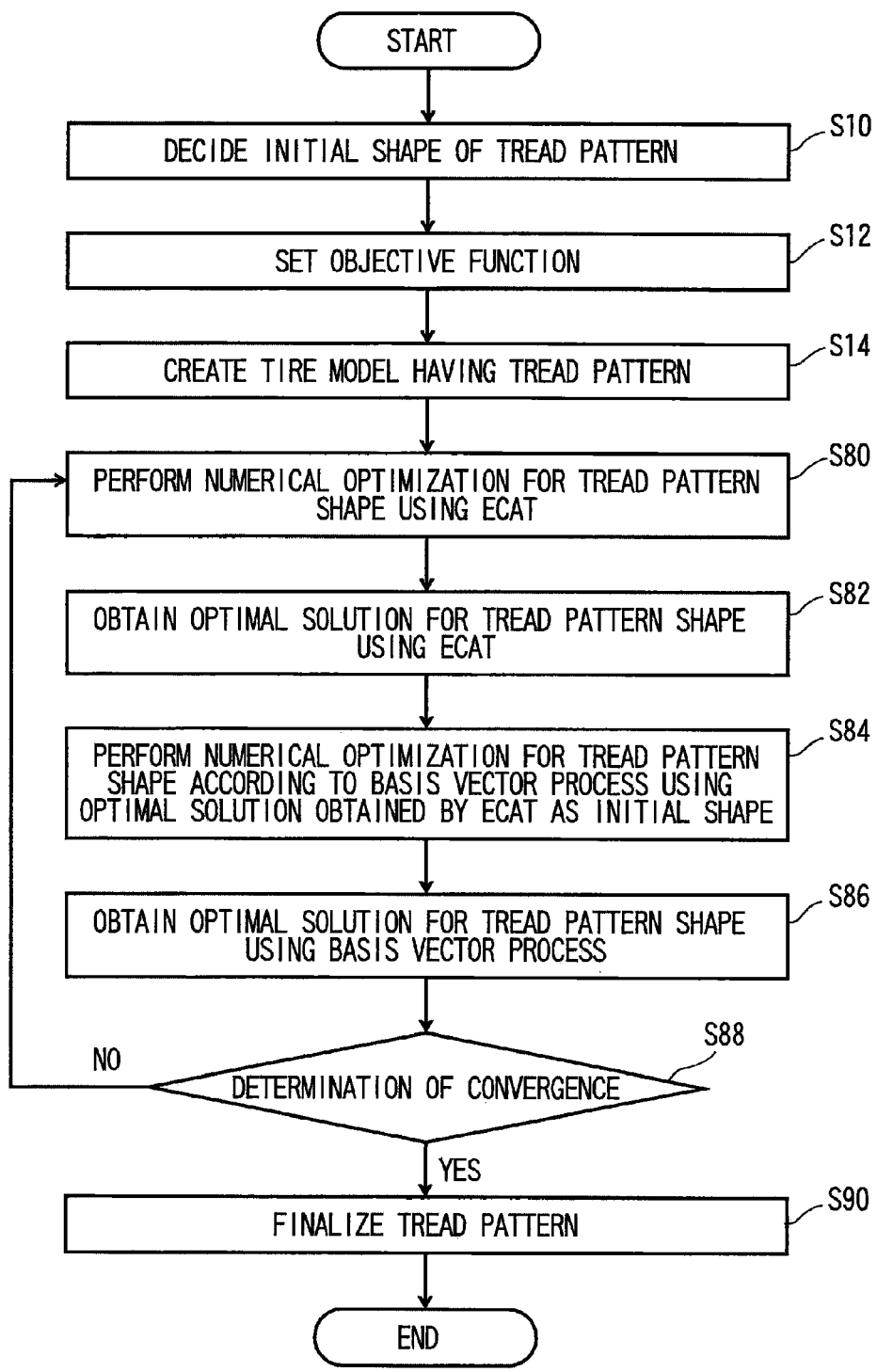
FIG. 12 is a flow chart showing a flow of processes of a tire design method in a third embodiment of the invention.

FIG. 12 is a flow chart showing a flow of processes of a method of designing a pneumatic tire in a third embodiment. The present embodiment is characterized in that a numerical optimization using an ECAT and a numerical optimization using a basis vector process as in the second embodiment are coupled with each other. That is, the two types of numerical optimizations are repeatedly carried out until a predetermined condition for convergence is satisfied.

Specifically, in the present embodiment, a tire model having a tread pattern is created as in the second embodiment (steps S10 to S14). Then, a calculation for optimizing the shape of the tread pattern is carried out using an ECAT (steps S80 and S82). A numerical optimization is carried out using a basis vector process for the tread pattern shape whose initial shape is the optimal solution obtained using an ECAT (steps S84 and S86). Thereafter, convergence is determined based on the resultant optimal solution (step S88). The methods for numerical optimizations using an ECAT and a basis vector process, respectively, are the same as those in the first embodiment, and no description will therefore be made on them.

Referring to the determination of convergence, for example, the determination may be made based on whether a value $OBJ_{n+1}$ of the objective function resulting from an optimal solution obtained at an (n+1)-th cycle of step S86 represents an improvement of a predetermined degree or more from a value $OBJ_n$ of the objective function resulting from an optimal solution obtained at an n-th cycle of step S86. When there is no improvement of the predetermined degree or more, it is determined that convergence has been achieved. It should be noted that n=0, 1, 2, . . . and that only $OBJ_O$ represents the value of the objective function at the time when the tread pattern has the initial shape decided at step S10. For example, in a case wherein a decrease in the value of the objective function is regarded as an improvement, it may be determined that convergence has been achieved when $OBJ_n - OBJ_{n+1} < \epsilon$ ($\epsilon$ represents a predetermined positive value) is true.

When the above expression is not satisfied or when it is determined that convergence has not been achieved yet, the process returns to step S80. Then, a numerical optimization is carried out according to the ECAT method on the tread pattern shape using the optimal solution obtained at step S86 as an initial shape. Thereafter, steps S82 to S86 are executed in the same manner as described above, and steps S80 to S88 are repeated until it is determined at step S88 that convergence has been achieved.

When it is determined at step S88 that convergence has been achieved, the tread pattern shape is decided at step S90 based on the optimal solution for the tread pattern shape at that time.

As thus described, the numerical optimization using an ECAT and the numerical optimization using a basis vector process are repeated until convergence takes place, which makes it possible to find a tread pattern shape that is more suitable for the purpose.

In the present embodiment, the determination of convergence (step S88) is carried out only after a numerical optimization is performed using a basis vector process. Alternatively, the step of determining convergence may be additionally carried out after a numerical optimization is performed using an ECAT (or between steps S82 and S84). In this case, the process may proceed to step S84 when convergence has not been achieved, and the process may proceed to step S90 when convergence has been achieved.

The present embodiment has been described as a case in which a numerical optimization using an ECAT takes precedence. A step of determining convergence as described above may be added also in a case in which a numerical optimization using a basis vector process takes precedence as in the first embodiment, and the two types of numerical optimizations may be repeatedly performed until convergence takes place.

EXAMPLE

An Example of optimization of a tire tread pattern using the optimization method in the first embodiment will now be described.

In this Example, a structural analysis was carried out on a tire having a tire size 205/65R15 at an air pressure of 200 kPa and a load of 450N using a rim type 15×6JJ. Distribution of a ground contact pressure of the tire was used as an objective function, and an optimization problem for minimizing the ground contact pressure distribution was defined.

The tread pattern had an original shape as shown in FIG. 4A, and a basis vector process was executed to create base shapes 1 and 2 as shown in FIGS. 4B and 4C based on the original shape. Referring to ranges of limitation, a weighting factor $\alpha 1 = -1$ to 1 was applied to the base shape 1, and a weighting factor $\alpha 2 = -1$ to 1 was applied to the base shape 2. As a result of the numerical optimization using a basis vector process, optimal solutions $\alpha 1 = 1$ and $\alpha 2 = -1$ were obtained for the respective design variables. An optimized layout as shown in FIG. 4D was obtained.

Figure 13:
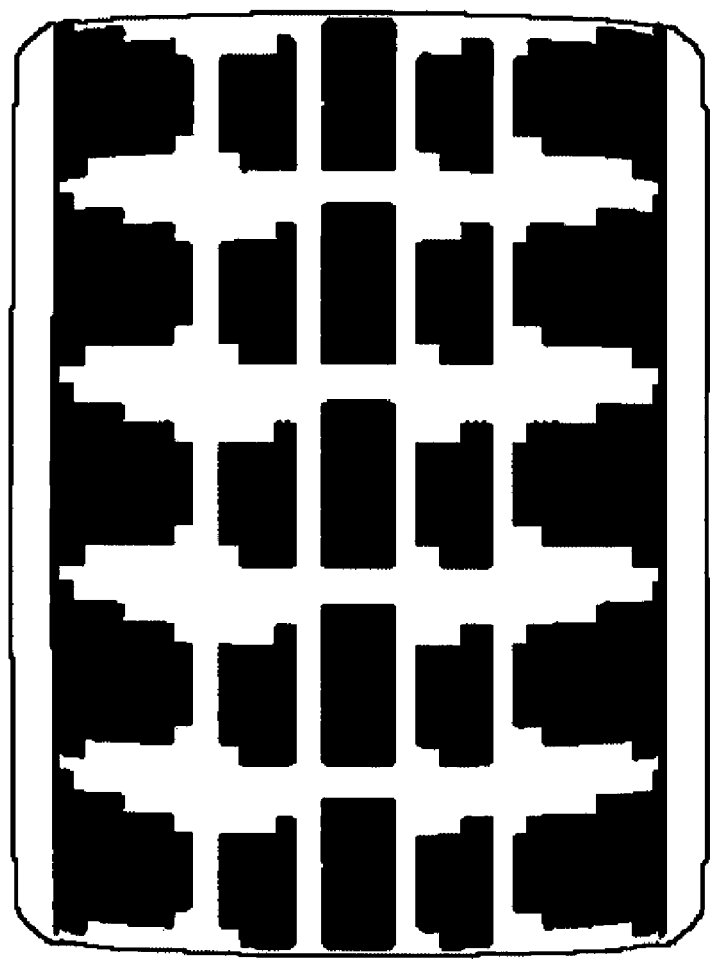
FIG. 13 shows a final layout obtained through optimization in an example.

An ECAT was executed using the layout shown in FIG. 4D as an initial layout, and a structural analysis was carried out by developing the layout into five pitches in the circumferential direction. Ground contact pressure distribution of each element was used as an evaluation index. Elements were categorized into twenty classes, and a removal factor $\beta$ of 1.3 and an $\alpha$-cut value of 0.96 were used. Further, a void ratio upper limit of 0.35 was set. As a result of the optimization calculation using an ECAT, an optimized layout as shown in FIG. 13 was obtained (FIG. 13 shows a landing shape of the tire having five pitches of the layout extending in the circumferential direction).

A design method on a trial-and-error basis involving repetition of a cycle of designing, structural analysis, and re-designing according to the related art was carried out as comparative example 1 for comparison with Example. A design method involving only a calculation for optimizing the topology and the shape of a tread pattern using an ECAT was carried out as comparative example 2. A design method involving only a calculation for optimizing the shape of the tread pattern using basis vector process was carried out as comparative example 3.

Table 1 shows computational costs required for optimization carried out by Example and comparative examples 1 to 3, and the table also shows the effect of improving an objective function (ground contact pressure distribution) in comparison to values of the function for a conventional product tire as a controlled tire.

The effect of improving the objective function is indicated using index numbers representing analytical values based on the structural analysis and measured values measured about the actually manufactured tire where each of an analytical value and an actually measured value of ground contact pressure distribution of the conventional product tire is represented by an index number 100. Computational costs are indicated by index numbers where the time required for the calculation in comparative example 1 is represented by an index 100. An index number represents a shorter calculation time and a lower computational cost, the smaller the value of the index is.

TABLE 1

|  |  | Conventional Product | Comparative Example 1 | Comparative Example 2 | Comparative Example 3 | Example |
|---|---|---|---|---|---|---|
| Optimization Calculation |  | — | — | ECAT | Basis Vector | ECAT + Basis Vector |
| Objective Function (ground contact pressure distribution) | Analytical Value | 100 | 96 | 93 | 94 | 91 |
|  | Measured Value | 100 | 97 | 93 | 93 | 90 |
| Computation Cost |  | — | 100 | 70 | 65 | 75 |

As shown in Table 1, in Example, a significant improvement of ground contact pressure distribution was achieved when compared to the conventional product tire and comparative example 1, and a significant reduction in calculation time was achieved when compared to comparative example 1. Example was also advantageous in the effect of improving ground contact pressure distribution compared to comparative examples 2 and 3 wherein an ECAT or a basis vector process is used alone.

The invention can be advantageously used in designing various tires such as pneumatic radial tires.

What is claimed is:

1. A computer-implemented tire design method comprising:
   (a) providing an objective function representative of tire performance;
   (b) performing a first numerical optimization using a basis vector process to obtain a first optimal solution which optimizes the objective function, the optimization being performed using a model provided by dividing at least part of a tread pattern into a plurality of elements; and
   (c) performing a second numerical optimization using an ECAT to obtain a second optimal solution which optimizes the objective function, the optimization being performed using the model provided by dividing at least part of a tread pattern into a plurality of elements,
   wherein either step (b) or (c) is executed first, the numerical optimization at the other step being performed using the optimal solution obtained at the first step as an initial shape;
   (d) finalizing a tread pattern shape based on the optimal solution obtained from the last of steps (b) or (c) to be executed; and
   (e) producing a tire design having the finalized tread pattern shape.

2. The tire design method according to claim 1, the step (c) comprising:
   (c1) creating a tire model having a plurality of elements or divisions of a tire by developing one pitch unit of an initial layout of a tread pattern shape into a plurality of pitches in the circumferential direction of the tire;
   (c2) calculating an evaluation index for each element through a structural analysis using the tire model having the initial layout;
   (c3) integrating calculated evaluation indices into one pitch unit for each element associated with the indices, classifying the elements according to the magnitudes of the integrated evaluation indices to determine a plurality of classes to which elements subject to removal belong, and selecting elements to be removed from each of classes thus determined;
   (c4) selecting elements to be added from among the elements which have been removed;
   (c5) obtaining a layout of the current generation through the removal and addition of elements at the steps (c3) and (c4) to create a tire model by developing one pitch unit of the layout into a plurality of pitches in the circumferential direction of the tire;
   (c6) calculating an evaluation index for each element through a structural analysis using the tire model of the layout of the current generation; and
   (c7) determining convergence of the objective function from the calculated evaluation indices, updating the layout to the layout of the current generation and returning to the step (c3) when it is determined that convergence has not occurred, and deciding to adopt the layout of the current generation as the second optimal solution when it is determined that convergence has occurred.

3. The tire design method according to claim 2, comprising:
   determining elements to be added among the elements which have been removed based on a constraint condition on a void ratio of the tread pattern at step (c4).

4. The tire design method according to claim 2, comprising:
   selecting elements to be removed from the classes subject to removal using fuzzy partitioning at step (c3).

5. The tire design method according to claim 1, the step (b) comprising:
   (b1) creating models of a plurality of base shapes based on a model of an original shape of at least a part of the tread pattern, the base models having the same number of nodes and the same element combination information as those of the original model and node coordinate values different from those of the original model;
   (b2) defining a basis vector from a vector whose components are the coordinate values of a node of the original shape and a vector whose components are the coordinate values of a node of the base shape, defining a vector whose components are the coordinate values of each node of a model for optimization by linearly combining basis vectors, and setting a weighting factor for the linear combination as a design variable; and
   (b3) obtaining a set of values of the design variables for optimizing the objective function based on an expression representing a relationship between the vector of the model for optimization and the basis vectors to obtain the first optimal solution of the shape of at least the part of the tread pattern.

6. The tire design method according to claim 5, the step (b3) comprising:
   determining that the objective function cannot be calculated when one or more elements of the model for optimization have a distorted shape;
   reconfiguring the elements having the distorted shape into a mesh form to provide a revised model for optimization; and
   calculating the objective function based on the revised model for optimization.

7. The tire design method according to claim 1, further comprising:
   prior to executing step (d): determining convergence based on the first optimal solution obtained at step (b) or the second optimal solution obtained at step (c); and
   repeating the first numerical optimization at step (b) and the second numerical optimization at step (c) until convergence takes place.

8. The tire manufacturing method comprising:
   (a) providing an objective function representative of tire performance;
   (b) performing a first numerical optimization using a basis vector process to obtain a first optimal solution which optimizes the objective function, the optimization being performed using a model provided by dividing at least part of a tread pattern into a plurality of elements; and
   (c) performing a second numerical optimization using an ECAT to obtain a second optimal solution which optimizes the objective function, the optimization being performed using the model provided by dividing at least part of a tread pattern into a plurality of elements, wherein either step (b) or (c) is executed first, the numerical optimization at the other step being performed using the optimal solution obtained at the first step as an initial shape;
(d) finalizing a tread pattern shape based on the optimal solution obtained from the last of steps (b) or (c) to be executed;
(e) producing a tire design having the finalized tread pattern shape; and
(f) manufacturing a tire based on the tire design.

* * * * *